(12) United States Patent
Clark

(10) Patent No.: US 6,749,690 B2
(45) Date of Patent: Jun. 15, 2004

(54) ALIGNING MASK SEGMENTS TO PROVIDE AN ASSEMBLED MASK FOR PRODUCING OLED DEVICES

(75) Inventor: Thomas K. Clark, Walworth, NY (US)

(73) Assignee: Eastman Kodak Company, Rochester, NY (US)

( * ) Notice: Subject to any disclaimer, the term of this patent is extended or adjusted under 35 U.S.C. 154(b) by 373 days.

(21) Appl. No.: 10/016,451

(22) Filed: Dec. 10, 2001

(65) Prior Publication Data

US 2003/0108805 A1 Jun. 12, 2003

(51) Int. Cl.$^7$ .............................................. C23C 16/00
(52) U.S. Cl. ........................ 118/721; 118/720; 118/504; 118/505
(58) Field of Search ................................. 118/721, 720, 118/504, 505; 427/259; 148/DIG. 102

(56) References Cited

U.S. PATENT DOCUMENTS

| 4,676,193 | A | * | 6/1987 | Martin | 118/720 |
| 6,146,489 | A | * | 11/2000 | Wirth | 156/280 |
| 6,475,287 | B1 | * | 11/2002 | Clark | 118/721 |
| 6,589,382 | B2 | * | 7/2003 | Clark et al. | 156/304.3 |

* cited by examiner

Primary Examiner—Christopher G. Young
(74) Attorney, Agent, or Firm—Raymond L. Owens

(57) ABSTRACT

An alignment device for permitting a deposition mask having a plurality of magnetic mask segments to be positioned relative to a substrate to facilitate simultaneous deposition of organic material on to the substrate which will be part of an organic light emitting device.

7 Claims, 4 Drawing Sheets

ALIGNING MASK SEGMENTS TO PROVIDE AN ASSEMBLED MASK FOR PRODUCING OLED DEVICES

CROSS REFERENCE TO RELATED APPLICATIONS

Reference is made to commonly-assigned copending U.S. patent application Ser. No. 09/893,250, filed Jun. 21, 2001, entitled "Alignment Device Which Facilitates Deposition Of Organic Material Through A Deposition Mask", by Thomas K. Clark and U.S. patent application Ser. No. 09/994,095 filed Nov. 26, 2001, entitled "Aligning Mask Segments To Provide A Stitched Mask For Producing OLED Devices" by Thomas K. Clark et al, the disclosures of which are incorporated herein."

FIELD OF THE INVENTION

The present invention relates to the deposition of organic material through a mask onto a substrate in the process of making an organic light emitting diode (OLED).

BACKGROUND OF THE INVENTION

In the making of organic light emitting devices (OLED) there are a number of steps in which organic layers are deposited on or over a substrate. It is essential that a deposition mask be aligned and properly mounted so that accurate deposition takes place. The deposition mask is typically a precision mask made of a magnetic material and is thin and malleable. The deposition mask is lithographically patterned and because it is thin permits the appropriate thickness of organic material to be deposited on or over the substrate. The maximum size of a single piece depositions mask is limited by manufacturing process limitations, specifically dimensional accuracy and overall size. Another limitation of the present technology is the inability to replace damaged areas of the deposition mask. The deposition mask manufacturing process is subject to error and the increase in size and complexity of a mask design account for lower yield when manufacturing deposition masks. There is a need for more accurate, larger format precision deposition mask. There is also a need for a method of replacement of defective areas of the deposition mask.

SUMMARY OF THE INVENTION

It is an object of the present invention to increase the throughput of forming OLED devices which use deposition masks.

It is a further object of the present invention to provide a structure which will permit the simultaneous formation of organic layers of an OLED device through different mask segments.

These objects are achieved in an alignment and holding device for permitting a deposition mask having a plurality of magnetic mask segments to be mounted to a frame for positioning relative to a substrate to facilitate simultaneous deposition of organic material on to the substrate which will be part of an organic light emitting device, comprising:

(a) a base having a first set of alignment pins and a second set of alignment pins;

(b) two or more plates segments (four depicted) secured to the base;

(c) a frame having two or more openings (four depicted) aligned with the plates segments, the frame having a plurality of magnets magnetic cross bars located in cross bar receiving channels being formed with a first set of alignment pin receiving holes corresponding to the position of the first set of pins so that the frame is removably mounted to the base;

(d) a plurality of magnetic mask segments positioned on the plate to define the deposition mask;

(e) a transparent flat plate contacting the second set of alignment pins and the magnetic mask segments and being sized to expose portions of segments of the magnetic mask segments;

(f) means of securing mask sections to perimeter of the frame in the exposed areas;

(g) means for securing the magnetic mask segments to the cross bars of the frame via the cross bar channel and magnetic cross bars.

These objects are also achieved by a method of aligning a plurality of masks segments to form a deposition mask which permits a more effective manufacture of organic light emitting diode devices, comprising the steps of:

(a) providing a base having a first and second set of alignment pins and securing two or more plates segments to the base;

(b) providing a frame having central openings aligned with the plates segments and formed with a first set of alignment pin receiving holes;

(c) aligning the frame and base by positioning the first set of alignment pins in the first set of alignment pin receiving holes;

(d) positioning the plurality of magnetic mask segments on the plates segments and frame;

(e) providing a transparent flat plate aligned with the second set of alignment pins on the plurality of magnetic mask segments, such transparent flat plate having fiducial marks;

(f) positioning the magnetic mask segments to be properly aligned with the fiducial marks and securing the magnetic mask segments to the frame; and (g) magnetically securing the plurality of magnetic mask segments to the frame using magnetic cross bars bonded in cross bar receiving channels cross bars providing an assembled deposition mask with each magnetic mask segment being adapted to be used in the deposition of organic material on a single substrate.

It is a feature of the present invention that by mounting and securing magnetic mask segments using a plurality of magnets magnetic cross bars a mask can be produced that provides improved dimensional accuracy of a deposition mask having the ability to remove and replace mask sections. The present invention makes possible the manufacture of a larger format deposition mask.

An advantage of the present invention is that the deposition magnetic mask sections can be accurately assembled and mounted to a frame that is then positioned relative to the substrate. Magnetic mask segments can be held in place magnetically to make a mask assembly larger than is capable with single piece deposition mask. An assembled deposition mask can be disassembled to allow for removal of defective magnetic mask segments. The magnetic mask segments can then be replaced. An assembled deposition mask being made up of small segments are less expensive to produce. Assembled deposition masks have greater life expectancy, being repairable. An assembled deposition mask has greater accuracy than present single piece deposition masks (of similar size). This approach will improve yield and make possible deposition of larger substrates.

DETAILED DESCRIPTION OF THE PREFERRED EMBODIMENTS

Figure 1:
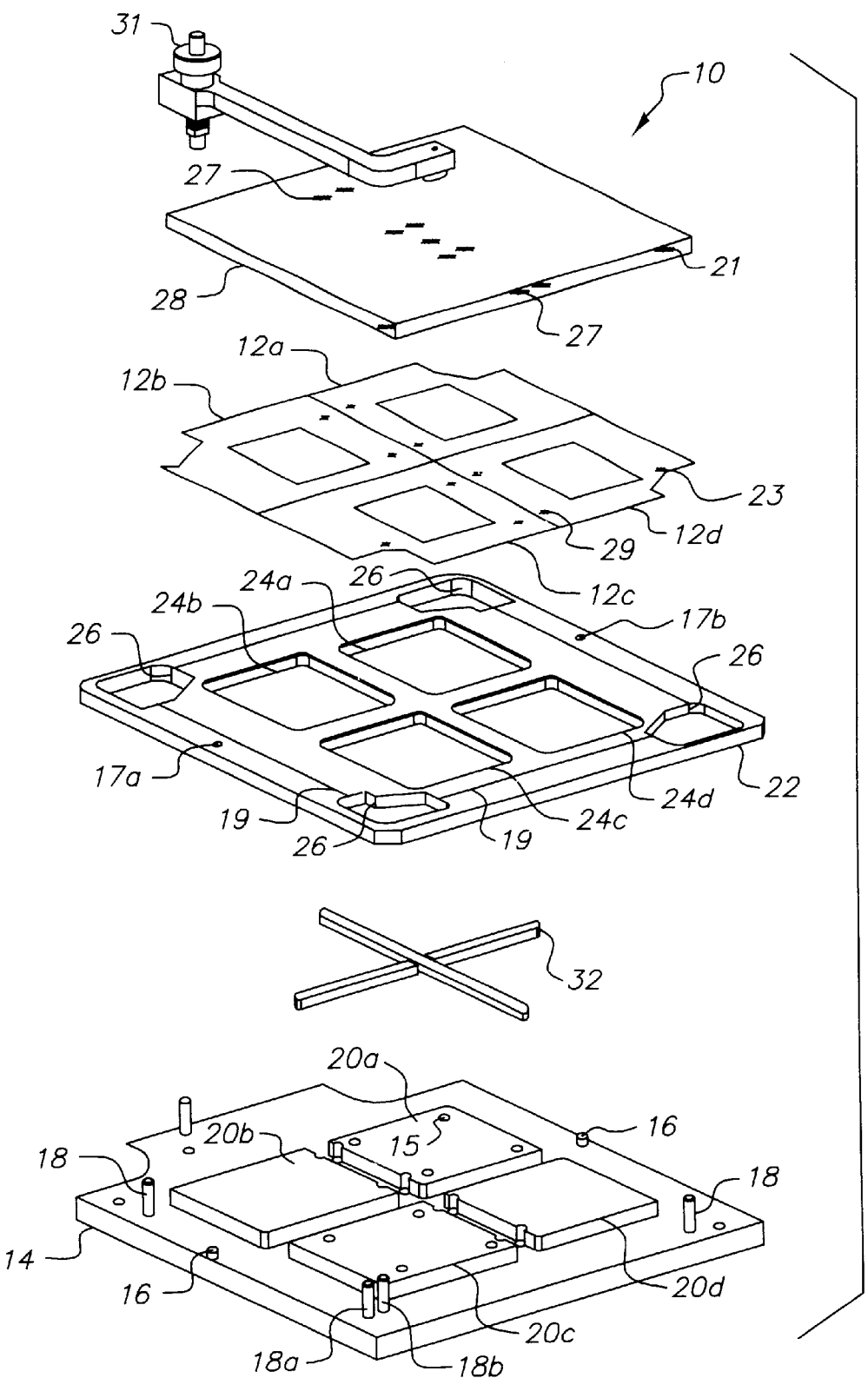
FIG. 1 is an exploded view of an alignment device for assembly of the deposition mask in accordance with the present invention.

FIG. 1 depicts an exploded view of an alignment device 10 for assembly and mounting of assembled magnetic mask segments 12a, 12b, 12c, 12d. On the deposition mask 12 there are four segments 12a, 12b, 12c, 12d (See FIG. 1 and FIG. 2). The mask segments are initially aligned with engraved alignment lines 19 on frame 22 when the disposition magnetic mask segments 12a, 12b, 12c, 12d are positioned. The alignment device 10 permits the deposition mask 12 to be positioned relative to a substrate of an OLED device to facilitate simultaneous deposition of organic material on to the substrate which will be part of an organic light emitting device. The alignment device 10 includes a base 14 having a first set of alignment pins 16 and a second set of alignment pins 18. The alignment pins 16 as shown include two pins disposed on opposite sides of the base 14. The base 14 is generally rectangular and the second set of alignment pins 18 are disposed in three corners of the base 14. As shown, in one of the corners there are two alignment pins 18a and 18b but in the remaining two corners there is a single alignment pin 18.

A series of plate segments 20a, 20b, 20c, 20d are secured to the base 14 by any convenient means. The plate segments 20a, 20b, 20c, 20d are fastened by screws to the base 14. Although the screws are not shown for convenience of illustration are depicted by holes 15. The plate segments 20a, 20b, 20c, 20d provide a top flat surface on which the magnetic mask segments 12 are to be positioned. A frame 22, generally rectangular in shape, has central openings 24a, 24b, 24c, 24d. Cross bar receiving channels 30 are formed in the frame 22. A magnetic cross bar 32 having a plurality of magnets are disposed in the cross bar receiving channels 30 (see FIG. 3). Around each of the four corners of the frame 22 there are cutout segments 26. In three of the cutout segments 26, the alignment pins 18 project through (see FIG. 2.)

The purpose of these cutout segments 26 is to facilitate positioning of the frame 22 in a vacuum chamber which permits the engagement of a mechanism in the vacuum chamber as well understood in the art. The frame 22 is removable and mounted to the base 14 using alignment pins 16. The alignment pins 16 pass through holes 17a and 17b in the frame 22. The hole 17a has a circular cross-section and hole 17b has an oblong shape to permit proper alignment. The deposition mask 12 includes segments 12a, 12b, 12c, and 12d are positioned on plate segments 20a, 20b, 20c, 20d and frame 22. A transparent flat plate 28 is positioned to contact the second set of alignment pins 18 and magnetic mask segments 12 and is sized to expose edge segments of the deposition mask 12 when it is properly positioned. The transparent flat plate 28 includes fiducial marks 21 and 27 which are electroplated. The fiducial marks 21 and 27 are cross lines which are shown larger than they actually are. The fiducial marks 21 and 27 are used to permit alignment with fiducial marks 23 and 29 on the magnetic mask segments 12. The alignment of fiducial marks 27 and 29 form an appropriate relationship between mask segments 12a, 12b, 12c, and 12d. The exposed segments of the deposition mask 12 are secured to the frame 22 by adhesive tape 25 which is in engagement with the magnetic mask segments 12a, 12b, 12c and 12d and perimeter of frame 22. The magnetic mask segments 12a, 12b, 12c and 12d are secured to the frame 22 by the magnetic attraction of the magnetic mask segments 12a, 12b, 12c and 12d to the magnets of magnetic cross bar 32. The cross bar magnets can be adhesively bonded in magnetic cross bar receiving channels 30.

Figure 2:
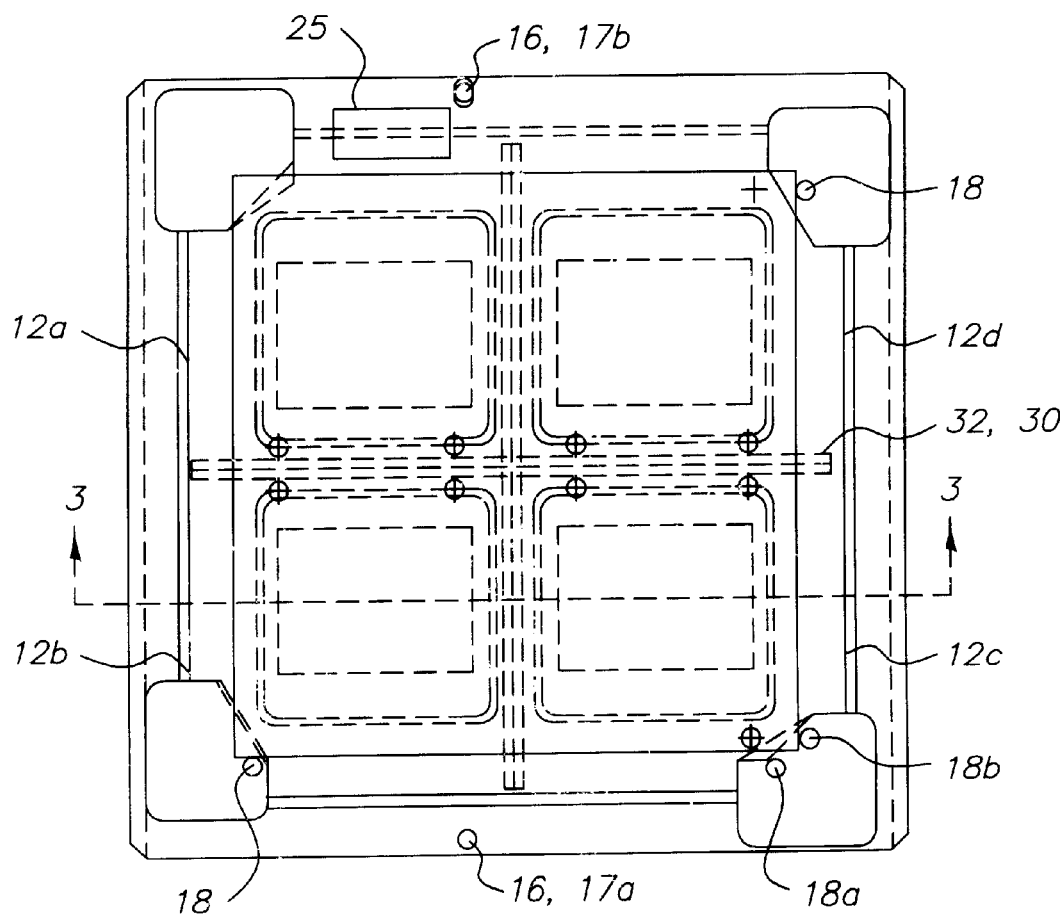
FIG. 2 is a top view of the alignment device of FIG. 1.
Figure 3:
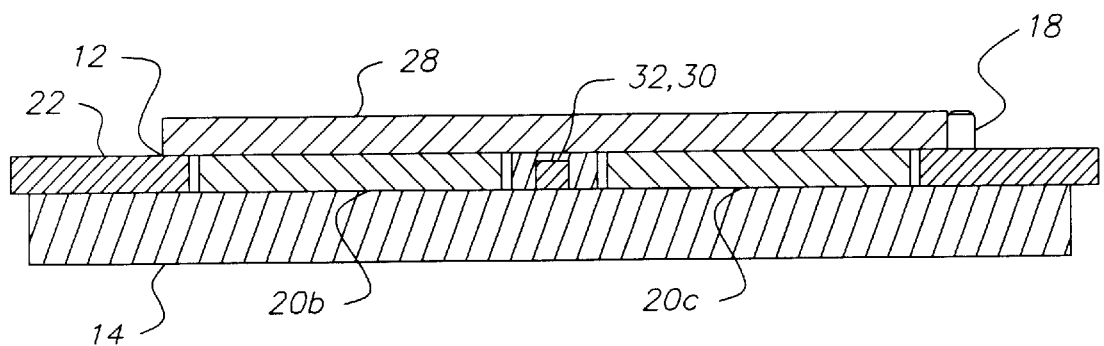
FIG. 3 is a cross sectional view taken along lines 3—3 of FIG. 2.
Figure 4:
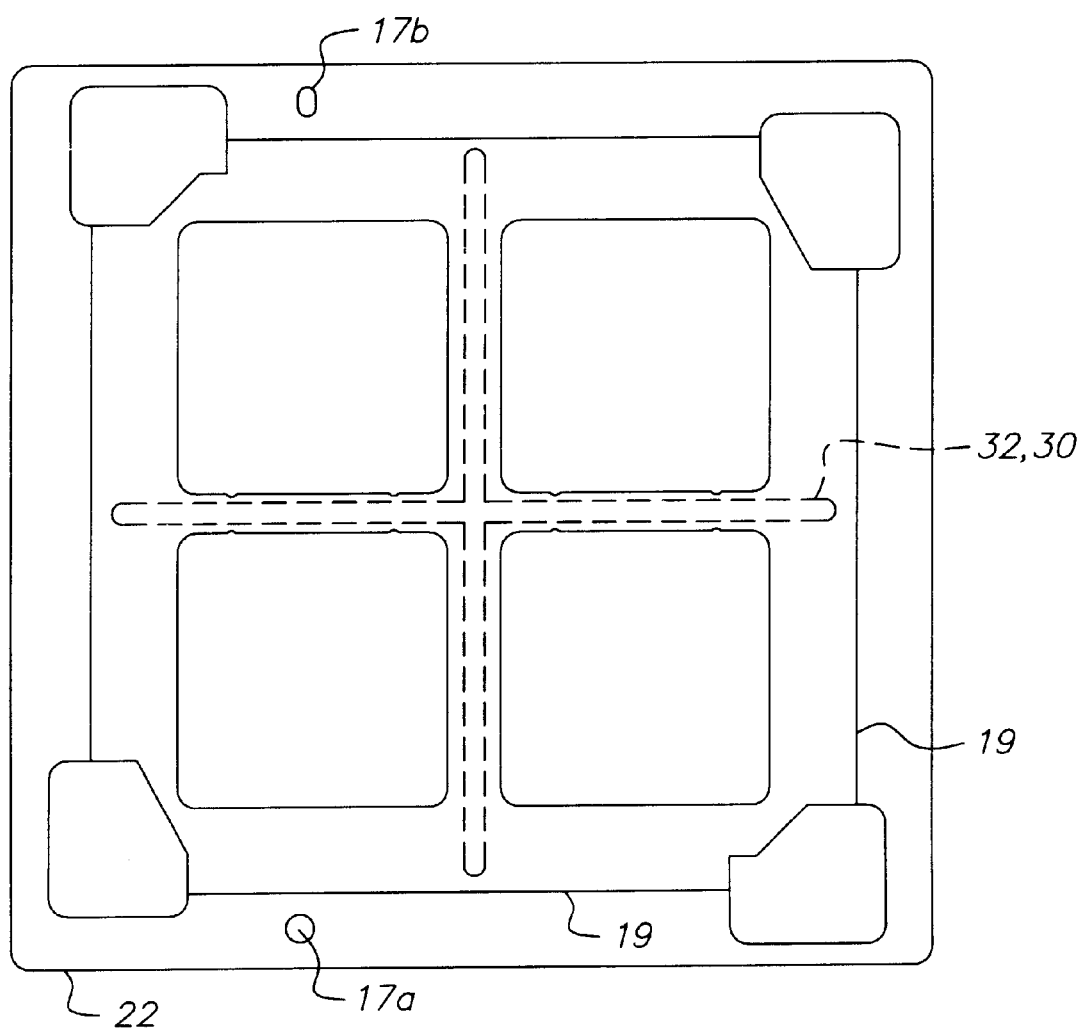
FIG. 4 is a top view of frame 22.

Turning now to FIGS. 2 and 3 which respectively show a top view of the alignment device 10 and a cross-sectional view taken along lines 3—3. In particular with reference to FIG. 3, the base 14, plate segments 20a, 20b, 20c, 20d, the magnetic mask segments 12a, 12b, 12c and 12d and the transparent flat plate 28 are shown stacked one on top of the other. The top surface of frame 22 is shown to be planar with plate segments 20a, 20b, 20c, 20d. One of the pins 18 is shown in its alignment position.

The alignment of the magnetic mask segments 12a, 12b, 12c and 12d in the alignment device 10 will now be described. The frame 22 is mounted on base 14 using alignment pins 16. The alignment pins 16 are located on the base 14 in such a manner that frame 22 can be mounted in one orientation only. The frame 22 when mounted on base 14 is to be positioned in a manner that aligns plate segments 20 top surface is at the same identical height as frame 22. The magnetic mask segments 12a, 12b, 12c, 12d are visually aligned on top of plates segments 20 and frame 22 using engraved alignment lines 19 on frame 22 for initial alignment as shown in FIG. 2. The transparent flat plate 28 is placed on top of deposition mask 12 and against alignment pins 18, 18a, and 18b. The magnetic mask segments 12a, 12b, 12c, 12d are manually aligned using the photo-etched fiducials 23 and 29 corresponding with fiducials 21 and 27 located on transparent flat plate 28. The relationship of transparent flat plate 28 and alignment pins 18, 18a, and 18b must remain against the alignment pins 18a and 18b during the alignment process. After alignment the deposition mask sections are held in place using clamp 31.

The deposition mask 12 is then attached to frame 22 using two methods. In the first method adhesive tape 25 secure the deposition mask 12 to the perimeter of frame 22. Only one of the adhesive.tape 25 is shown although typically there will be two for each edge and they secure the deposition mask 12 to the frame 22. The magnetic mask segments 12a, 12b, 12c and 12d are then held using a plurality of magnets to the frame cross bar 32. The term "cross bar" will be understood to mean one or more magnetic members which when positioned in the cross bar receiving channels 30 secures the magnetic mask segments 12a, 12b, 12c and 12d. For example, the cross bar receiving channel 30 can extend along a single line segment rather than the two shown and receive one or more magnetic members. In the preferred embodiment, the magnetic cross bar 32 can include a single magnetic member made of a rubberized material and two shorter members on either side of the single member which completes the magnetic cross bar 32.

The deposition mask 12 is made from magnetic material. The amount of ferrous metals is such that the field exerted by the magnets provide within the frame 22 causes the deposition mask 12 to be secured to the frame 22 and held in a planar fashion.

After the deposition mask 12 has been assembled and mounted on frame 22 using alignment device 10, the transparent flat plate 28 is removed. The assembled deposition mask 12 and frame 22 are removed from base 14. It is the assembled deposition mask 12 and frame 22 that are placed in a chamber (not shown).

The invention has been described in detail with particular reference to certain preferred embodiments thereof, but it will be understood that variations and modifications can be effected within the spirit and scope of the invention.

PARTS LIST 10 alignment device
12 deposition mask
12a magnetic mask segment
12b magnetic mask segment
12c magnetic mask segment
12d magnetic mask segment
14 base
15 holes
16 first set of alignment pins
17a hole
17b hole
18 second set of alignment pins
18a alignment pin
18b alignment pin
19 engraved alignment lines
20a plate segment
20b plate segment
20c plate segment
20d plate segment
21 fiducial marks
22 frame
23 fiducial marks
24a open segment
24b open segment
24c open segment
24d open segment
25 adhesive tape Parts List cont'd 26 cut-out segment
27 fiducial marks
28 transparent flat plate
29 fiducial marks
30 cross bar receiving channel
31 clamp
32 magnetic cross bar

What is claimed:

1. An alignment device for permitting a deposition mask having a plurality of mask segments to be positioned relative to a substrate to facilitate simultaneous deposition of organic material onto the substrate which will be part of an organic light emitting device, comprising:
   (a) a base having a first set of alignment pins and a second set of alignment pins;
   (b) a series of spaced apart plate segments secured to the base;
   (c) a frame having openings aligned with the spaced apart plate segments, the frame being formed with a first set of alignment pin receiving holes corresponding to the position of the first set of alignment pins to permit the frame to be removably mounted to the base surrounding each of the plate segments;
   (d) the frame defining cross bar receiving channels;
   (e) a magnetic cross bar disposed in the cross bar receiving channels;
   (f) a plurality of magnetic mask segments positioned on the plate to define the deposition mask so that when the frame is mounted to the base the magnetic field from the magnetic cross bar secures portions of the magnetic mask segments to the frame;
   (g) a transparent flat plate contacting the second set of alignment pins and the deposition mask and being sized to expose segments of the deposition mask; and
   (h) means for securing the magnetic mask segments to the perimeter of the frame.

2. A method of aligning a plurality of magnetic masks segments to form a deposition mask which permits more effective manufacture of organic light emitting diode devices, comprising the steps of:
   (a) providing a base having a first and second set of alignment pins and securing spaced apart plate segments to the base;
   (b) providing a frame having openings aligned with the spaced apart plates, the frame being formed with a first set of alignment pin receiving holes corresponding to the position of the first set of alignment pins to permit the frame to be removably mounted to the base and defining cross bar receiving channels between the spaced apart plates;
   (c) providing a magnetic cross bar in the cross bar receiving channels;
   (d) aligning the frame and base by positioning the first set of alignment pins in the first set of alignment pin receiving holes;
   (e) positioning the plurality of magnetic mask segments on the spaced apart plates segments so that the magnetic cross bar in the mounted frame secures the magnetic mask segments to the frame;
   (f) providing a transparent flat plate aligned with the second set of alignment pins on the plurality of magnetic mask segments, such transparent flat plate having fiducial marks; and
   (g) positioning the magnetic mask segments to be properly aligned with the fiducial marks and securing the magnetic mask segments to the perimeter of the frame.

3. The method of claim 2 where in the first set of alignment pins include two spaced apart pins positioned to align the frame relative to the base and plate.

4. The method of claim 2 wherein the frame includes four spaced cut out magnetic mask segments and the second set of alignment pins extend beyond the surface of the frame in three of the four cut-out segments to engage the transparent flat plate and wherein at least two of the alignment pins of the second set of alignment pins are positioned in one cut-out magnetic mask segment to engage two separate edges of the transparent flat plate.

5. The method of claim 2 wherein the frame includes alignment lines for initial positioning of the magnetic mask segments to properly align such magnetic mask segments on the spaced apart plates segments.

6. The method of claim 2 wherein the transparent flat plate and the magnetic mask segments include fiducial marks which also when aligned facilitate proper alignment of the mask to the frame.

7. The method of claim 2 wherein the securing of the magnetic mask segments to the magnetic cross bar is accomplished by using a plurality of magnets.

* * * * *